(12) United States Patent
Suzuki et al.

(10) Patent No.: US 6,168,908 B1
(45) Date of Patent: Jan. 2, 2001

(54) PROCESS FOR FORMING A CURED FILM OF A THERMOPLASTIC RESIN

(75) Inventors: Masayoshi Suzuki, Mie; Tomohiro Utaka, Ibaraki; Masayuki Endo, Mie, all of (JP)

(73) Assignee: JSR Corporation, Tokyo (JP)

( * ) Notice: Under 35 U.S.C. 154(b), the term of this patent shall be extended for 0 days.

(21) Appl. No.: 09/166,776

(22) Filed: Oct. 6, 1998

(30) Foreign Application Priority Data

Oct. 9, 1997 (JP) .................................................. 9-277128
Mar. 26, 1998 (JP) ................................................ 10-098443

(51) Int. Cl.⁷ ...................................................... G03F 7/26
(52) U.S. Cl. ........................... 430/325; 430/328; 430/330
(58) Field of Search .................................... 430/325, 328, 430/330

(56) References Cited

U.S. PATENT DOCUMENTS

| | | | | |
|---|---|---|---|---|
| 5,399,604 | * | 3/1995 | Sano ...................... | 524/356 |
| 5,707,558 | * | 1/1998 | Inomata ................ | 252/600 |
| 5,821,277 | * | 10/1998 | Hirayama ............. | 522/50 |

FOREIGN PATENT DOCUMENTS 0 520 626   12/1992   (EP) .
0 581 536   2/1994   (EP) .

OTHER PUBLICATIONS

Patent Abstracts of Japan, vol. 96, No. 7, Jul. 31, 1996, JP 8–075915, Mar. 22, 1996.

Patent Abstracts of Japan, vol. 96, No. 2, Feb. 29, 1996, JP 7–268155, Oct. 17, 1995.

* cited by examiner

*Primary Examiner*—Mark F. Huff
*Assistant Examiner*—Nicole Barreca
(74) *Attorney, Agent, or Firm*—Oblon, Spivak, McClelland, Maier & Neustadt, P.C.

(57) ABSTRACT

A process for forming a cured film comprising the steps of: coating an alkali-soluble thermosetting resin composition on a substrate, and baking it; coating a radiation sensitive resin composition on the coated film, and baking it, exposing the radiation sensitive resin composition on the substrate to radiation through a predetermined mask and baking it; carrying out development with an alkaline developer; immersing the substrate carrying the coated films in a stripping solution; and heating the alkali-soluble thermosetting resin remaining on the substrate to obtain a cured film pattern.

7 Claims, No Drawings

PROCESS FOR FORMING A CURED FILM OF A THERMOPLASTIC RESIN

DETAILED DESCRIPTION OF THE INVENTION

The present invention relates to a cured film and a process for forming the same. More specifically, it relates to a process for forming a cured film pattern by coating a radiation sensitive resin composition on a thermosetting resin composition which is not sensitive to radiation and patterning the lower layer thermosetting resin composition, which is useful as a protective film, flattening film and interlayer insulating film of electronic parts, particularly an interlayer insulating film for liquid crystal display elements, integrated circuit elements and solid image pick-up elements.

On an electronic part such as a liquid crystal display element, integrated circuit element or solid image pick-up element, a flattening film for securing flatness for the surface of the electronic part, a protective film for preventing deterioration or damage, and an insulating film for keeping electric insulation are formed. In a thin film transistor liquid crystal display element and integrated circuit element, an interlayer film for insulating laminar wires from each other is further provided.

Due to a recent trend toward an increase in the densities of the above elements and wires in the above elements, a resin composition which can provide a film having a low dielectric constant is desired. Further, there is a case where transparency is required for an interlayer insulating film as a more important factor. Particularly, for an insulating film used in a liquid crystal display element, transparency is an essential factor. To form a transparent electrode on the insulating film, heat resistance is also an important factor.

However, when a conventional radiation sensitive resin is heated at a high temperature to form an interlayer insulating film, for example, the oxidation of the resin takes place due to the high acidity of a sensitizer contained in the resin and a film having sufficient transparency cannot be obtained. Further, the obtained film has a high dielectric constant due to high polarity.

It is therefore an object of the present invention to provide a process for forming a cured film having a low dielectric constant and excellent flatness, heat resistance, solvent resistance, transparency, insulating properties and process allowance.

Other objects and advantages of the present invention will become apparent from the following description.

The inventors of the present invention have conducted intensive studies on the above problems and have found that the above problems can be solved by using a combination of specific resin compositions.

According to the present invention, the above objects and advantages of the present invention can be attained by a process for forming a cured film, which comprises the steps of:

(1) coating an alkali-soluble thermosetting resin composition on a substrate, and baking it;
(2) coating a radiation sensitive resin composition on the coated film, and baking it;
(3) exposing the radiation sensitive resin composition on the substrate to radiation through a predetermined mask and baking it;
(4) carrying out development with an alkaline developer;
(5) immersing the substrate carrying the coated films in a stripping solution to remove the upper layer film; and
(6) heating the lower layer film of alkali-soluble thermosetting resin remaining on the substrate to obtain a cured film pattern.

The present invention will be described in detail hereinafter. A description is first given of the radiation sensitive resin composition and alkali-soluble thermosetting resin.

Radiation Sensitive Resin Composition

In the process of the present invention, the radiation sensitive resin composition preferably comprises an alkali-soluble resin, particularly a novolak resin, polyvinylphenol or copolymer of vinylphenol and other olefin copolymerizable therewith, a radiation sensitive compound, a solvent and other additives as required.

The novolak resin is obtained by polycondensing a phenol with an aldehyde in the presence of an acid catalyst. Illustrative examples of the phenol include phenol, o-cresol, m-cresol, p-cresol, o-ethylphenyl, m-ethylphenyl, p-ethylphenol, o-butylphenol, m-butylphenol, p-butylphenol, 2,3-xylenol, 2,4-xylenol, 2,5-xylenol, 3,4-xylenol, 3,5-xylenol, 2,3,5-trimethylphenol, 3,4,5-trimethylphenol, p-phenylphenol, hydroquinone, catechol, resorcinol, 2-methylresorcinol, pyrogallol, α-naphthol, β-naphthol, bisphenol A, dihydroxybenzoic ester, gallic ester, o-nitrophenol, m-nitrophenol, p-nitrophenol, o-chlorophenol, m-chlorophenol, p-chlorophenol and the like. Of these compounds, o-cresol, m-cresol, p-cresol, 2,3-xylenol, 2,4-xylenol, 2,5-xylenol, 2,3,5-trimethylphenol, resorcinol and 2-methylresorcinol are preferred. These phenols may be used alone or in combination of two or more.

Illustrative examples of the aldehyde to be polycondensed with the phenol include formaldehyde, trioxan, paraformaldehyde, benzaldehyde, acetaldehyde, propylaldehyde, phenylaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, o-ethylbenzaldehyde, m-ethylbenzaldehyde, p-ethylbenzaldehyde, p-n-normalbutylaldehyde, furfural, 1-naphthaldehyde, 2-naphthaldehyde, 2-hydroxy-1-naphthaldehyde and the like. Of these, formaldehyde is particularly preferred. These aldehydes may be used alone or in combination of two or more. The aldehyde is generally used in an amount of 0.7 to 3 moles, preferably 0.7 to 2 moles, based on 1 mole of the phenol.

As the acid catalyst may be used hydrochloric acid, nitric acid, sulfuric acid, formic acid, acetic acid, oxalic acid or the like. The amount of the acid catalyst used is $1 \times 10^{-4}$ to $5 \times 10^{-1}$ mole based on 1 mole of the phenol.

Water is generally used as a reaction medium in the polycondensation reaction but a hydrophilic solvent may be used as a reaction medium when the phenol used in the polycondensation reaction does not dissolve in an aqueous solution of an aldehyde and the reaction is carried out in a heterogeneous system at the beginning of the reaction. The solvent used in this case is an alcohol such as methanol, ethanol or butanol; or a cyclic ether such as tetrahydrofuran or dioxane. The amount of the reaction medium used is preferably 20 to 100 parts by weight based on 100 parts by weight of the reaction raw materials.

The polycondensation reaction temperature can be suitably adjusted according to the reactivity of the reaction raw materials but is generally 10 to 200° C. After the end of the polycondensation reaction, the temperature is generally raised to 130 to 230° C. to remove the unreacted raw materials, the acid catalyst and the reaction medium remaining in the system, a volatile content is distilled off at a reduced pressure, and the novolak resin is collected.

The weight average molecular weight (to be referred to as "Mw" hereinafter) in terms of polystyrene of the novolak resin is generally in the range of 2,000 to 20,000, preferably 3,000 to 15,000. When the Mw is more than 20,000, it may be difficult to coat the composition on a wafer uniformly, and developability and sensitivity may lower. When the Mw is less than 2,000, the alkali resistance of it as the upper layer film may lower.

A polyvinylphenol and a copolymer of vinylphenol and other olefin copolymerizable therewith may also be used as the alkali-soluble resin as described above.

The copolymer may be a copolymer obtained by preparing a copolymer of t-butoxystyrene or acetoxystyrene and other olefin copolymerizable therewith and hydrolyzing it.

Illustrative examples of the other olefin copolymerizable with vinylphenol (or t-butoxystyrene or acetoxystyrene) include (meth)acryloyl group-containing radical polymerizable compounds such as methyl (meth)acrylate, ethyl (meth)acrylate, n-propyl (meth)acrylate, i-propyl (meth)acrylate, n-butyl (meth)acrylate, sec-butyl (meth)acrylate, tert-butyl (meth)acrylate, 2-ethylhexyl (meth)acrylate, lauryl (meth)acrylate, dodecyl (meth)acrylate, dicyclopentanyl (meth)acrylate, isobornyl (meth)acrylate, cyclohexyl (meth)acrylate, 2-methylcyclohexyl (meth)acrylate, dicyclohexyl (meth)acrylate, adamantyl (meth)acrylate, allyl (meth)acrylate, propargyl (meth)acrylate, phenyl (meth)acrylate, naphthyl (meth)acrylate, anthracenyl (meth)acrylate, cyclopentyl (meth)acrylate, furyl (meth)acrylate, tetrahydrofuryl (meth)acrylate, pyranyl (meth)acrylate, benzyl (meth)acrylate, phenethyl (meth)acrylate, cresyl (meth)acrylate, 1,1,1-trifluoroethyl (meth)acrylate, perfluoroethyl (meth)acrylate, perfluoro-n-propyl (meth)acrylate, perfluoro-i-propyl (meth)acrylate, triphenylmethyl (meth)acrylate, cumyl (meth)acrylate, 2-hydroxyethyl (meth)acrylate, 2-hydroxypropyl (meth)acrylate, amide (meth)acrylate, N,N-dimethylamide (meth)acrylate, N, N-dipropylamide (meth)acrylate, anilide (meth)acrylate and (meth)acrylonitrile; vinyl group-containing radical polymerizable compounds such as acrolein, vinyl chloride, vinylidene chloride, N-vinylpyrrolidone, vinyl acetate, styrene, α-methylstyrene, o-methylstyrene, m-methylstyrene, p-methylstyrene, p-methoxystyrene, p-methoxymethylstyrene, p-tert-butoxystyrene, chloromethylstyrene, butadiene, 2,3-dimethylbutadiene and isoprene; unsaturated carboxylic diesters such as diethyl maleate, diethyl fumarate and diethyl itaconate; and the like.

Of these, styrene, α-methylstyrene, p-tert-butoxystyrene, dicyclopentanyl methacrylate, methyl methacrylate, tert-butyl (meth)acrylate, 2-hydroxyethyl methacrylate, benzyl methacrylate, butadiene and isoprene are preferred.

The weight average molecular weight (to be referred to as "Mw" hereinafter) in terms of polystyrene of the polyvinylphenol or vinylphenol copolymer resin is generally in the range of 1,000 to 30,000, preferably 2,000 to 25,000. When the Mw is more than 30,000, it may be difficult to coat the composition on a wafer uniformly, and developability and sensitivity may lower. When the Mw is less than 1,000, the alkali resistance of it as the upper layer film may lower.

The radiation sensitive resin composition of the present invention may be for a positive or negative pattern. However, when the thermally cured film is used as an interlayer insulating film for an LCD or the like, the radiation sensitive resin composition is preferably a positive pattern. When the radiation sensitive resin composition is a negative pattern, a load exerted on an exposure lens is large because the almost entire surface of the radiation sensitive resin composition is exposed, thereby causing deterioration in the performance of the lens. Further, nonuniformity of exposure in a joint between exposure frames and printing due to the halation of the lower layer wire occur. When the radiation sensitive resin composition is for a positive pattern, the exposure area is small, and nonuniformity of exposure in the joint and the printing of the wire do not occur. Therefore, the radiation sensitive resin composition for a positive pattern is preferred from this point of view.

Preferred examples of the radiation sensitive compound used in the present invention include 1, 2-benzoquinonediazide-4-sulfonic esters, 1,2-naphthoquinonediazide-4-sulfonic esters, 1,2-naphthoquinonediazide-5-sulfonic esters and 1,2-naphthoquinonediazide-6-sulfonic esters of polyhydroxy compounds. Of these, 1,2-naphthoquinonediazide-4-sulfonic esters and 1,2-naphthoquinonediazide-5-sulfonic esters are especially preferred.

The radiation sensitive compound is obtained, for example, by reacting a polyhydroxy compound with quinonediazidesulfonyl chloride in the presence of a basic catalyst. The proportion (average esterification rate) of the quinonediazidesulfonic ester to the total of the hydroxyl groups of the polyhydroxy compound is 20% or more and 100% or less, preferably 40% or more and 95% or less. When the average esterification rate is too low, it may be difficult to form a pattern, and while the rate is too high, sensitivity may lower.

The polyhydroxy compound used is not particularly limited but exemplified by compounds represented by the following formulas:

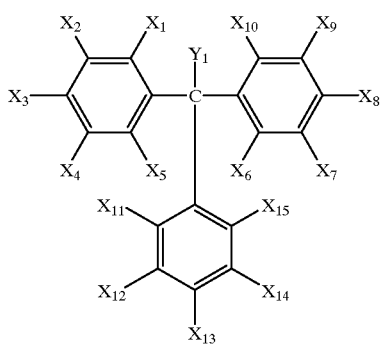

wherein $X_1$ to $X_{15}$ are the same or different and each a hydrogen atom, alkyl group having 1 to 4 carbon atoms, alkoxy group having 1 to 4 carbon atoms, aryl group having 6 to 10 carbon atoms or hydroxyl group, provided that at least one of $X_1$ to $X_5$ and at least one of $X_6$ to $X_{10}$ are a hydroxyl group, and $Y_1$ is a hydrogen atom or alkyl group having 1 to 4 carbon atoms,

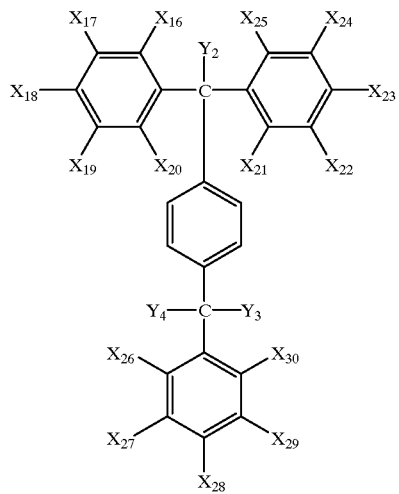

wherein $X_{16}$ to $X_{30}$ are the same as $X_1$ to $X_{15}$, provided that at least one of $X_{16}$ to $X_{20}$, at least one of $X_{21}$ to $X_{25}$ and at least one of $X_{26}$ to $X_{30}$ are a hydroxyl group, $Y_2$ to $Y_4$ are the same or different and each a hydrogen atom or alkyl group having 1 to 4 carbon atoms,

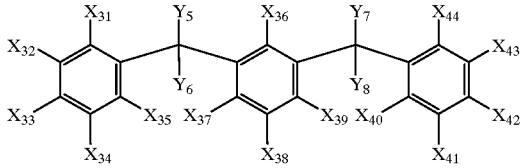

lp;1pwherein $X_{31}$ to $X_{44}$ are the same as $X_1$ to $X_{15}$, provided that at least one of $X_{31}$ to $X_{35}$ is a hydroxyl group, and $Y_5$ to $Y_8$ are the same or different and each a hydrogen atom or alkyl group having 1 to 4 carbon atoms,

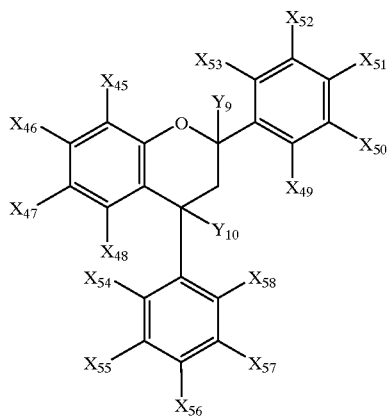

wherein $X_{45}$ to $X_{58}$ are the same or different and each a hydrogen atom, halogen atom, alkyl group having 1 to 4 carbon atoms, alkoxy group having 1 to 4 carbon atoms, cycloalkyl group having 5 to 7 carbon atoms or hydroxyl group, provided that at least one of $X_{45}$ to $X_{48}$ and at least one of $X_{49}$ to $X_{53}$ are a hydroxyl group, and $Y_9$ and $Y_{10}$ are the same or different and each a hydrogen atom, alkyl group having 1 to 4 carbon atoms or cycloalkyl group having 5 to 7 carbon atoms,

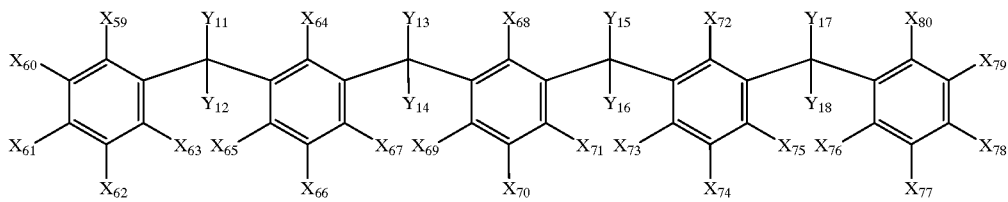

wherein $X_{59}$ to $X_{80}$ are the same as $X_{45}$ to $X_{58}$, provided that at least one of $X_{59}$ to $X_{63}$, at least one of $X_{64}$ to $X_{67}$, at least one of $X_{72}$ to $X_{75}$ and at least one of $X_{76}$ to $X_{80}$ are a hydroxyl group, and $Y_{11}$ to $Y_{18}$ are the same or different and each a hydrogen atom or alkyl group having 1 to 4 carbon atoms, and

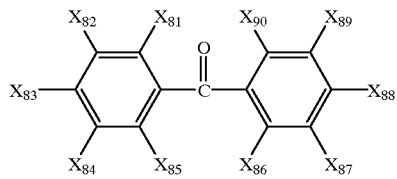

wherein $X_{81}$ to $X_{90}$ are the same or different and each a hydrogen atom, alkoxy group having 1 to 4 carbon atoms, aryl group having 6 to 10 carbon atoms or hydroxyl group, provided that at least one of $X_{81}$ to $X_{90}$ is a hydroxyl group.

In the radiation sensitive resin composition in the present invention, the radiation sensitive compound is preferably used in an amount of 5 to 60 parts by weight, particularly preferably 10 to 50 parts by weight based on 100 parts by weight of the alkali-soluble resin. The above radiation sensitive compounds may be used alone or in combination of two or more.

The total weight of the residual 1,2-quinonediazidesulfonyl groups in the composition is preferably adjusted to 5 to 50 wt %, more preferably 10 to 30 wt % based on the total solid content of the composition.

The radiation sensitive resin composition in the present invention may contain various additives such as a sensitizer, surfactant, dissolution promoting agent and the like.

The sensitizer is used to improve the sensitivity of the composition. Illustrative examples of the sensitizer include 2H-pyrido-(3,2-b)-1,4-oxazin-3(4H)-ones, 10OH-pyrido-(3,2-b)-1,4-benzothiazines, urazols, hydantoins, barbituric acids, glycine anhydrides, 1-hydroxybenzotriazoles, alloxans, maleimides and the like. The sensitizer is generally used in an amount of 50 parts or less by weight based on 100 parts by weight of the radiation sensitive compound.

The surfactant is used to improve the coating properties and developability of the composition. Illustrative examples of the surfactant include polyoxyethylene lauryl ether, polyoxyethylene oleyl ether, polyoxyethylene octylphenyl ether, polyoxyethylene nonylphenyl ether, polyethylene glycol dilaurate, polyethylene glycol distearate, F Top EF301, EF303 and EF352 (trade names, manufactured by Shin Akita Kasei Co., Ltd.), M EGAFAC F171, F172 and F173 (trade names, manufactured by Dainippon Ink & Chemicals, Inc.), Fluorad FC430 and FC431 (trade names, manufactured by Sumitomo 3M Limited), Asahi Guard AG710 and Surflon S-382, SC-101, SC-102, SC-103, SC-104, SC-105 and SC-106 (trade names, manufactured by Asahi Glass Co., Ltd.), KP341 (trade name, manufactured by Shin-Etsu Chemical Co., Ltd.), Polyflow No. 75 and No. 95 (trade names, manufactured by Kyoeisha and Yushi Kagaku Kogyo Co., Ltd.) and the like. The surfactant is generally used in an amount of 2 parts or less by weight based on 100 parts by weight of the alkali-soluble resin.

In the present invention, a dissolution promoting agent comprising a low-molecular weight phenol compound may be added to promote the alkali solubility of the alkali-soluble resin. The dissolution promoting agent is suitably a phenol compound having 2 to 5 benzene rings, as exemplified by compounds represented by the following formulas (1) to (9):

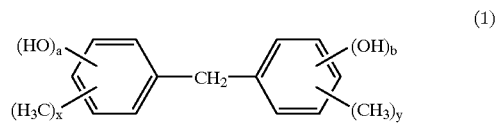

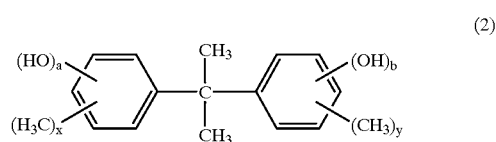

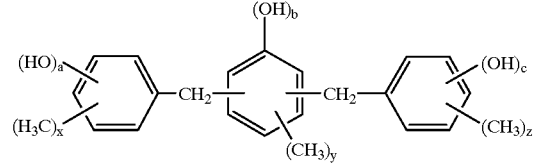

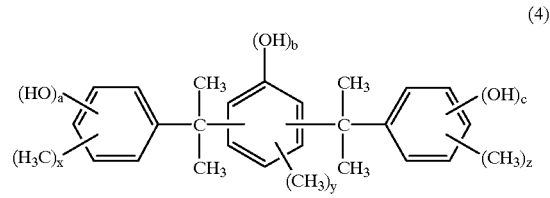

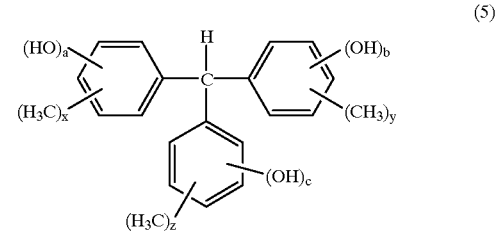

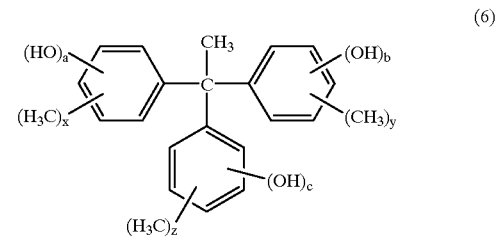

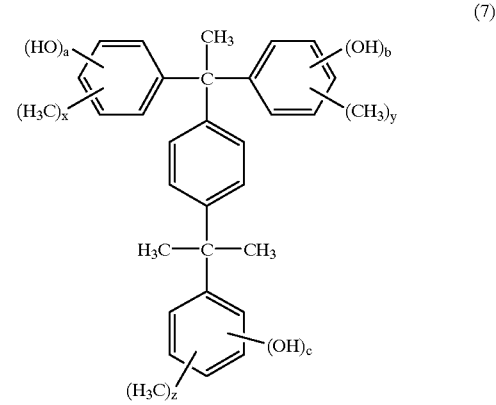

-continued

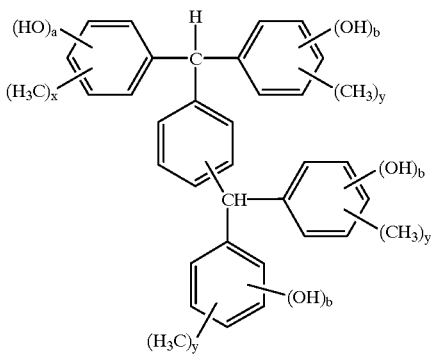
(8)

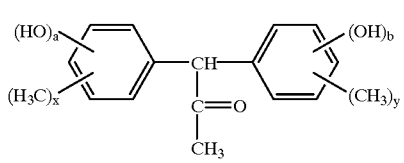
(9)

wherein a, b and c are each an integer of 0 to 3 (excluding a case where a, b and c are all 0), and x, y and z are each an integer of 0 to 3, provided that $a+x \leq 5$, $b+y \leq 5$ and $c+z \leq 5$ ($b+y \leq 4$ for compounds represented by formulas (3) and (4)).

The amount of the dissolution promoting agent is generally 50 parts or less by weight based on 100 parts by weight of the alkali-soluble resin.

The solvent is preferably an aprotic solvent to prevent intermixing with the alkali-soluble thermosetting resin used as a lower layer film.

Illustrative examples of the aprotic solvent include aliphatic monoketones such as methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxyproplonate, butyl 2-ethoxypropionate, methyl 2-propoxypropionate, ethyl 2-propoxypropionate, propyl 2-propoxypropionate, butyl 2-propoxypropionate, 2-heptanone, 3-heptanone, 4-heptanone, methyl-n-hexylketone, methyl-n-octylketone, methyl-n-dodecylketone, ethyl-n-pentylketone, di-n-propylketone, diisopropyl ketone, n-propylisopropyl ketone, di-n-butylketone and di-n-pentylketone; and alicyclic monoketones such as 2-methylcyclohexanone, 3-methylcyclohexanone, 4-methylcyclohexanone, 2-ethylcyclohexanone, 4-ethylcyclohexanone, methyl-n-hexylketone, 2-t-butylcyclohexanone, cycloheptanone, cyclooctanone, cyclononanone and cycloundecanone. Intermixing can be prevented more advantageously by adding hydrocarbons such as xylene, toluene, tetralin and bicyclohexyl to these.

These organic solvents may be used in combination of two or more.

Of these, ethyl 3-ethoxypropionate, propylene glycol monomethyl ether acetate, cyclohexanone, 2-heptanone and 3-heptanone are advantageously used as the solvent for preventing intermixing with the lower layer film in the present invention.

The solid content concentration of the radiation sensitive resin composition solution in the present invention is suitably selected according to application purpose, and is not particularly limited but preferably 5 to 50 wt %.

The radiation sensitive resin composition in the present invention is advantageously prepared by dissolving the alkali-soluble resin, the radiation sensitive compound and the above-described additives as required in a solvent so that the solid content should be 10 to 50 wt %, and filtering the resulting solution with a filter having a pore diameter of ca. 0.2 µm.

This composition is coated on the lower layer film (B) which will be detailed hereinafter by spin coating, flow coating or roll coating, exposed to radiation, preferably ultraviolet radiation, far ultraviolet radiation or electron beam, for forming a predetermined pattern and developed with a developer to form a pattern.

As the developer for the composition is used an alkaline aqueous solution prepared by dissolving an alkaline compound such as sodium hydroxide, potassium hydroxide, sodium carbonate, sodium silicate, sodium metasilicate, ammonia water, ethylamine, n-propylamlne, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-(5,4,0)-7-undecene, 1,5-diazabicyclo-(4,3,0)-5-nonene and the like into water to have a concentration of 0.1 to 10 wt %. The developer may contain a water-soluble organic solvent such as an alcohol exemplified by methanol and ethanol and a surfactant in suitable amounts. When the composition is developed with this alkaline aqueous solution developer, the composition is preferably rinsed with water after development.

Thermosetting Resin Composition

The thermosetting resin composition preferably comprises an alkali-soluble thermosetting resin, adhesion auxiliary, solvent and other additives as required.

The thermosetting resin used in the present invention is a copolymer of (b-1) an unsaturated carboxylic acid, (b-2) an epoxy group-containing radical polymerizable compound and (b-3) other radical polymerizable compound copolymerizable with the components (b-1) and (b-2) as required.

The unsaturated carboxylic acid (b-1) is preferably an unsaturated carboxylic acid having an ethylenically unsaturated double bond.

Illustrative examples of the unsaturated carboxylic acid (b-1) include monocarboxylic acids such as methacrylic acid, acrylic acid, crotonic acid, o-vinylbenzoic acid, m-vinylbenzoic acid and p-vinylbenzoic acid; and dicarboxylic acids such as maleic acid, fumaric acid, citraconic acid, mesaconic acid, itaconic acid, 1,4-cyclohexenedicarboxylic acid, 3-vinylphthalic acid, 4-vinylphthalic acid, methyl-5-norbornene-2,3-dicarboxylicacid, 3,4,5,6-tetrahydrophthalic acid, 1,2,3,6-tetrahydrophthalic acid and dimethyltetrahydrophthalic acid.

Of these, methacrylic acid, acrylic acid and itaconic acid are preferred.

In the present invention, a carboxylic anhydride, or a partly esterified product or partly amidated product of an unsaturated carboxylic acid in which part of a carboxylic acid group remains free, such as a half ester or half amide of an unsaturated dicarboxylic acid, may be also used as the unsaturated carboxylic acid (b-1).

The half ester or half amide of an unsaturated carboxylic acid is, for example, preferably monomethyl itaconate or monobutyl itaconate.

These unsaturated carboxylic acids may be used alone or in combination of two or more.

Illustrative examples of the epoxy group-containing radical polymerizable compound (b-2) include methacrylic esters such as glycidyl (meth)acrylate, α-ethylglycidyl (meth)acrylate, α-n-propylglycidyl (meth)acrylate, α-n-butylglycidyl (meth)acrylate, 2-methylglycidyl (meth) acrylate, 2-ethylglycidyl (meth)acrylate, 2-propylglycidyl (meth)acrylate, 3,4-epoxybutyl (meth)acrylate, 3,4-epoxyheptyl (meth)acrylate and α-ethyl-6,7-epoxyheptyl (meth)acrylate; and styrenes such as o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene.

Of these, glycidyl (meth)acrylate, 2-methylglycidyl (meth)acrylate, o-vinylbenzyl glycidyl ether, m-vinylbenzyl glycidyl ether and p-vinylbenzyl glycidyl ether are preferred.

These compounds (b-2) may be used alone or in combination of two or more.

Illustrative examples of the other radical polymerizable compound (b-3) used in the present invention include (meth) acryloyl group-containing radical polymerizable compounds such as methyl (meth)acrylate, ethyl (meth)acrylate, n-propyl (meth)acrylate, i-propyl (meth)acrylate, n-butyl (meth)acrylate, sec-butyl (meth)acrylate, tert-butyl (meth) acrylate, 2-ethylhexyl (meth)acrylate, lauryl (meth)acrylate, dodecyl (meth)acrylate, dicyclopentanyl (meth)acrylate, isobornyl (meth)acrylate, cyclohexyl (meth)acrylate, 2-methylcyclohexyl (meth)acrylate, dicyclohexyl (meth) acrylate, adamantyl (meth)acrylate, allyl (meth)acrylate, propargyl (meth)acrylate, phenyl (meth)acrylate, naphthyl (meth)acrylate, anthracenyl (meth)acrylate, cyclopentyl (meth)acrylate, furyl (meth)acrylate, tetrahydrofuryl (meth) acrylate, pyranyl (meth)acrylate, benzyl (meth)acrylate, phenethyl (meth)acrylate, cresyl (meth)acrylate, 1,1,1-trifluoroethyl (meth)acrylate, perfluoroethyl (meth)acrylate, perfluoro-n-propyl (meth)acrylate, perfluoro-i-propyl (meth)acrylate, triphenylmethyl (meth)acrylate, cumyl (meth)acrylate, 2-hydroxyethyl (meth)acrylate, 2-hydroxypropyl (meth)acrylate, amide (meth)acrylate, N,N-dimethylamide (meth)acrylate, N,N-dipropylamide (meth)acrylate, anilide (meth)acrylate and (meth) acrylonitrile; vinyl group-containing radical polymerizable compounds such as acrolein, vinyl chloride, vinylidene chloride, N-vinylpyrrolidone, vinyl acetate, styrene, α-methylstyrene, o-methylstyrene, m-methylstyrene, p-methylstyrene, p-methoxystyrene, p-methoxymethylstyrene, p-tert-butoxystyrene, chloromethylstyrene, butadiene, 2,3-dimethylbutadiene and isoprene; unsaturated dicarboxylic diesters such as diethyl maleate, diethyl fumarate and diethyl itaconate; and the like.

Of these, styrene, α-methylstyrene, p-tert-butoxystyrene, dicyclopentanyl methacrylate, methyl methacrylate, tert-butyl (meth)acrylate, 2-hydroxyethyl methacrylate, benzyl methacrylate, butadiene and isoprene are preferred. By using the compounds as a copolymerizable component, the alkali solubility, glass transition temperature and dielectric constant of the polymer can be controlled with the result that resolution, resin residue rate and other properties required for a resist and transparency, heat resistance and other properties required for a permanent film can be improved.

These compounds (b-3) may be used alone or in combination of two or more.

The thermosetting resin used in the present invention is obtained by copolymerizing the above compounds. The copolymer contains the unsaturated carboxylic acid (b-1) in an amount of preferably 5 to 50 wt %, particularly preferably 10 to 40 wt %, the epoxy group-containing radical polymerizable compound (b-2) in an amount of preferably 5 to 90 wt %, particularly preferably 30 to 70 w %, and the polymerizable unit of the other radical polymerizable compound (b-3) in an amount of preferably 70 wt % or less, particularly preferably 20 to 60 wt %.

When the content of the unsaturated carboxylic acid (b-1) is smaller than 5 wt %, the solubility in an alkali aqueous solution developer of the obtained coated film lowers with the result that developability and sensitivity may deteriorate. When the content is larger than 50 wt %, the solubility in the alkali aqueous solution of the obtained coated film becomes too high with the result that the resin residue rate of the obtained resist pattern may deteriorate. When the content of the epoxy group-containing compound (b-2) is smaller than 5 wt %, the crosslinking density of the obtained coated film becomes insufficient with the result that heat resistance and chemical resistance may lower. When the content is larger than 90 wt %, the solubility in an alkali aqueous solution of the obtained coated film lowers with the result that developability and sensitivity may deteriorate. Further, when the content of the other radical polymerizable compound (b-3) is larger than 70 wt %, the balance of the solubility in an alkali aqueous solution developer of the obtained polymer deteriorates with the result that patterning may become difficult.

The weight average molecular weight (to be referred to as "Mw" hereinafter) in terms of polystyrene of the thermosetting resin used in the present invention is generally $2 \times 10^3$ to $1 \times 10^5$, preferably $5 \times 10^3$ to $5 \times 10^4$. When the Mw is less than $2 \times 10^3$, the obtained coated film may experience deterioration in developability and resin residue rate and may be inferior in pattern shape and heat resistance. When the Mw is more than $1 \times 10^5$, the obtained coated film may have a reduction in sensitivity or may be inferior in pattern shape.

The thermosetting resin used in the present invention is obtained by copolymerizing the unsaturated carboxylic acid (b-1), the epoxy group-containing compound (b-2) and other radical polymerizable compound (b-3) as required in accordance with various polymerization methods. Generally, a method in which these compounds are copolymerized in a solvent in the presence of a catalyst (polymerization initiator) is preferred.

Illustrative examples of the solvent used for copolymerization include alcohols such as methanol, ethanol, propanol and butanol; cyclic ethers tetrahydrofuran and dioxane; cellosolve esters such as methyl cellosolve acetate and ethyl cellosolve acetate; glycol ethers such as ethylene glycol monomethyl ether, ethylene glycol monoethyl ether, diethylene glycol monomethyl ether, diethylene glycol monoethyl ether, diethylene glycol dimethyl ether, diethylene glycol ethyl methyl ether and propylene glycol monomethyl ether; propylene glycol alkylether acetates such as propylene glycol methyl ethyl acetate, propylene glycol ethyl ether acetate and propylene glycol propyl ether acetate; aromatic hydrocarbons such as benzene, toluene and xylene; ketones such as methyl ethyl ketone, cyclohexanone, 2-heptanone and 4-hydroxy-4-methyl-2-pentanone; esters such as ethyl 2-hydroxypropionate, ethyl 2-hydroxy-2-methylpropionate, ethyl 2-hydroxy-2-methylproplonate, ethyl ethoxyacetate, ethyl hydroxyacetate, methyl 2-hydroxy-3-methylbutyrate, methyl 3-methoxypropionate, ethyl 3-methoxypropionate, ethyl 3-ethoxypropionate, methyl 3-ethoxypropionate, ethyl acetate and butyl acetate; and polar solvents such as dimethyl formamide and N-methyl-2-pyrrolidone.

The solvent is generally used in an amount of 20 to 1,000 parts by weight based on 100 parts by weight of the total of the polymerizable compounds [(b-1), (b-2) and (b-3)].

Catalysts which are generally known as a radical polymerization initiator may be used as the catalyst. The catalysts include azo compounds such as 2,2'-azobisisobutyronitrile, 2,2'-azobis(2,4-dimethylvaleronitrile) and 2,2'-azobis(4-methoxy-2,4-dimethylvaleronitrile); organic peroxides and hydrogen peroxides such as benzoyl peroxide, lauroyl peroxide, t-butyl peroxypivalate and 1,1'-bis(t-butylperoxy) cyclohexane; and the like. When a peroxide is used as a radical polymerization initiator, it may be used in conjunction with a reducing agent as a redox polymerization initiator.

In the above copolymerization, a molecular weight controlling agent such as an α-methylstyrene dimer may be further added.

The above thermosetting resin has an carboxyl group derived from the unsaturated carboxylic acid (b-1) and an epoxy group derived from the epoxy group-containing compound (b-2) and hence, alkali solubility and self-crosslinkability. The thermosetting resin has appropriate solubility in an alkali aqueous solution and provides a thermosetting resin composition having high sensitivity, high resin residue rate and excellent developability. Further, a resist pattern obtained by using the thermosetting resin is excellent in such properties as heat resistance, adhesion to a substrate, transparency at a visible light range and chemical resistance.

The thermosetting resin composition may contain an adhesion auxiliaryto improve its adhesion to a substrate. Illustrative examples of the adhesion auxiliary include vinyltrimethoxysilane, vinyltriethoxysilane, vinyltris(2-methoxyethoxy)silane, N-(2-aminoethyl)3-aminopropylmethyl dimethoxysilane, N-(2-aminoethyl)3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane, 3-mercaptopropyl trimethoxysilane and the like. Of these, 3-glycidoxypropyl trimethoxysilane and 3-glycidoxypropylmethyl dimethoxysilane are preferred.

thermosetting resin composition in the present invention comprises the above copolymer and an organic solvent for dissolving this copolymer.

The organic solvent may be or may not be the organic solvent (solubilizing medium) used to produce the above-described copolymer. Illustrative examples of the organic solvent include hydroxycarboxylic esters such as methyl hydroxyacetate, ethyl hydroxyacetate, propyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate and butyl 3-hydroxypropionate; alkoxycarboxylic esters such as methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-propoxypropionate, ethyl 2-propoxypropionate, propyl 2-propoxypropionate, butyl 2-propoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate propyl 3-butoxypropionate and butyl 3-butoxypropionate; propylene glycol (mono)alkyl ethers such as propylene glycol (mono)methyl ether, propylene glycol ethyl ether, propylene glycol propyl ether and propylene glycol butyl ether; aliphatic monoketones such as 2-heptanone, 3-heptanone, 4-heptanone, methyl-n-hexyl ketone, propylene glycol (mono)di-n-butylketone, di-n-pentylketone and diacetone alcohol; and alicyclic monoketones such as 2-methylcyclohexanone, 3-methylcyclohexanone, 4-methylcyclohexanone, 2-ethylcyclohexanone, 4-ethylcyclohexanone, 2-t-butylcyclohexanone, cycloheptanone, cyclooctanone, cyclononanone and cycloundecanone.

These organic solvents may be used alone or in combination of two or more.

Of these, organic solvents having excellent solubility for thermosetting resins are preferred, as exemplified by methyl lactate, ethyl lactate, methyl 3-methoxypropionate, ethyl 3-ethoxypropionate, propylene glycol monomethyl ether, propylene glycol monomethyl ether acetate, cyclohexanone, 2-heptanone, 3-heptanone, 4-heptanone, methyl-n-hexyl ketone and diacetone alcohol. Of these, 2-heptanone, 3-heptanone, 4-heptanone and methyl-n-hexylketone are particularly preferred.

The thermosetting resin composition in the present invention is prepared as a solution of the thermosetting resin in the above solvent. The concentration of the copolymer (solid content) in the solution is suitably selected according to application purpose, and is not particularly limited but preferably about 5 to 50 wt %.

The thermosetting resin composition may contain a compound which has at least two epoxy groups in the molecule and no radical polymerizability to further improve its heat resistance and adhesion to a substrate. Illustrative examples of such a compound include bisphenol A epoxy resins such as Epicote 1001, 1002, 1003, 1004, 1007, 1009, 1010 and 828 (trade names, manufactured by Yuka Shell Epoxy Co., Ltd.); bisphenol F epoxy resins such as Epicote 807 (trade name, manufactured by Yuka Shell Epoxy Co., Ltd.); phenol novolak epoxy resins such as Epicote 152 and 154 (trade names, manufactured by Yuka Shell Epoxy Co., Ltd.), and EPPN 201 and 202 (trade names, manufactured by Nippon Kayaku Co., Ltd.); cresol novolak epoxy resins such as EOCN102, 103, 104S, 1020, 1025 and 1027 (trade names, manufactured by Nippon Kayaku Co., Ltd.), and Epicote 180S75 (trade name, manufactured by Yuka Shell Epoxy Co., Ltd.); polyphenol epoxy resins such as Epicote 1032H60 and XY4000 (trade names, manufactured by Yuka-Shell Epoxy Co., Ltd.); cyclic aliphatic epoxy resins such as CY-175, 177 and 179 and ERL-4234, 4299, 4221 and 4206 (trade names, manufactured by U.C.C. Co., Ltd.), Showdine 509 (trade name, manufactured by Showa Denko K.K.), Epiclon 200 and 400 (trade names, manufactured by Dainippon Ink & Chemicals, Inc.), Epicote 871 and 872 (trade names, manufactured by Yuka-Shell Epoxy Co., Ltd.), and ED-5661 and 5662 (trade names, manufactured by Cellanese Coating Co., Ltd.); aliphatic polyglycidyl ethers such as Epolite 100MF (manufactured by Kyoeisha Yushi Kagaku Kogyo Co., Ltd.) and Epiole TMP (manufactured by NOF Corporation).

The compound is used as required in an amount of 50 parts or less by weight based on 100 parts by weight of the thermosetting resin.

The thermosetting resin composition may further contain a surfactant to prevent striation and improve developability. Illustrative examples of the surfactant include polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; nonionic surfactants such as polyoxyethylene dialkyl esters including polyoxyethylene dilaurate and polyoxyethylene distearate; polysiloxane-based surfactants such as DC11PA, SH28PA, ST94PA, ST103PA, SH190, SH192, SH194, SF2902L, SF2904, SF2908, SF2909, SRX280A, SRX294A and SRX298 (manufactured by Toray Dow Corning Silicone Co., Ltd.); fluorine-based surfactants such as F Top EF301, 303 and 352 (manufactured by Shin Akita Kasei Co., Ltd.), M EGAFAC F-171, F-172 and F-173 (manufactured by Dainippon Ink & Chemicals, Inc.), Fluorad FC-430 and FC431 (manufactured by Sumitomo 3M Limited), and Asahi Guard AG710, Surflon S-382, SC-101, SC-102, SC-103, SC-104, SC-105 and SC-106 (manufactured by Asahi Glass Co., Ltd.); and (meth)acrylic acid copolymer-based surfactants such as Organosiloxane Polymer KP341 (Shin-Etsu Chemical Co., Ltd.) and Polyflow No. 57 and 95 (manufactured by Kyoeisha Yushi Kagaku Kogyo Co., Ltd.).

The surfactant is used as required in an amount of 5 wt % or less, preferably 1 wt % or less based on the solid content of the thermosetting resin.

The thermosetting resin may further contain an antistatic agent, storage stabilizer, defoaming agent, pigment, dye and the like as required.

Each Step of the Process of the Present Invention

The process of the present invention is effected by carrying out the following steps in the following order.

(1) An alkali-soluble thermosetting resin composition is coated on a substrate, and baked.

The thermosetting resin composition is preferably filtered before use. As means for filtering is a Millipore filter having a pore diameter of 0.2 to 1.0 μm.

The thus prepared thermosetting resin composition is coated on the surface of a substrate by spraying, roll coating, rotation coating or the like. Thereafter, the coated substrate is prebaked to remove the organic solvent so as to form the coated film of the thermosetting resin composition on the substrate.

The prebaking temperature is suitably determined according to the components and proportion of the thermosetting resin composition used and the type of the organic solvent. It is generally 50 to 200° C., preferably 70 to 170° C., more preferably 80 to 150° C. The prebaking time is generally 0.5 to 15 minutes.

(2) A radiation sensitive resin composition is further coated on the coated film, and baked.

The radiation sensitive resin composition is preferably filtered before use. As means for filtering is a Millipore filter having a pore diameter of 0.2 to 1.0 μm.

A solution of the thus prepared radiation sensitive resin composition is coated on the substrate surface having the coated film of the thermosetting resin composition by spraying, roll coating, rotation coating or the like. Thereafter, the coated substrate is prebaked to remove the organic solvent so as to form the coated film of the radiation sensitive resin composition on the coated film of the thermosetting resin composition formed on the substrate.

The prebaking temperature is suitably determined according to the components and proportion of the radiation sensitive resin composition and the type of the organic solvent. It is generally 50 to 200° C., preferably 70 to 170° C., more preferably 80 to 150° C. The prebaking time is generally 0.5 to 15 minutes.

(3) The radiation sensitive resin composition is exposed to radiation through a predetermined mask, and baked.

The radiation sensitive resin composition on the substrate is exposed to radiation through a mask having a predetermined pattern shape. The energy amount of the radiation, that is, the type of the radiation is suitably determined according to desired resolution and wavelength to which the radiation sensitive compound is sensitive. Generally speaking, ultraviolet radiation such as g-line(wavelength of 436 nm), h-line(405 nm) and i-line(365 nm), far ultraviolet radiation such as excimer laser beams (KrF, ArF), X-rays such as synchrotron radiation, and charged particle radiation such as electron beams may be used. Of these, radiations of g-line and i-line are preferred.

After irradiation of radiation, PEB (baking after exposure) is preferably carried out at room temperature to 200° C. before alkali development. The PEB time is generally 0.1 to 10 minutes.

(4) Development is carried out with an alkaline developer.

When the upper layer radiation sensitive resin composition is positive, portions exposed to radiation become alkali-soluble and dissolve in the developer. When the radiation sensitive resin composition is negative, the exposed portions become alkali-insoluble and unexposed portions dissolve in the alkaline developer. In either case, the lower layer thermosetting resin composition at portions dissolved in the alkaline developer, of the upper layer radiation sensitive resin composition also dissolve in the alkaline developer. Thus, a pattern consisting of a layer of the radiation sensitive resin composition and a layer of the thermosetting resin composition is formed.

The developer is an aqueous solution of an alkali such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, N-methyl-2-pyrrolidone, dimethylethanolamine, triethanolamine, tetramethylammonium hydroxide, tetraethylammonium hydroxide, choline, pyrrole, piperidine, 1,8-diazabicyclo[5.4.0]-7-undecene or 1,5-diazabicyclo[4.3.0]-5-nonene. The concentration of the alkali aqueous solution is generally 0.1 to 10 wt %, preferably 0.2 to 4.0 wt %, more preferably 0.5 to 3.0 wt %.

An aqueous solution prepared by adding a water-soluble organic solvent such as methanol or ethanol and a surfactant in suitable amounts to the above alkali aqueous solution may also be used as the developer.

The development time is generally 10 to 240 seconds. The development may be either puddle development or dip development. After development, the substrate is washed with running water for 30 to 240 seconds and dried with compressed air or compressed nitrogen to remove water on the substrate, and a film pattern is thus formed.

Preferably, the substrate having a film pattern is then baked again at a temperature higher than the aforementioned prebaking temperatures, for example, 80 to 250° C. to promote the crosslinking of the lower layer thermosetting resin so as to thermally cure the resin.

The alkali solubility of the radiation sensitive resin composition can be increased by exposure to radiation as required. This is advantageous when an alkali aqueous solution is used as a stripping solution.

(5) Then, the substrate having a film pattern is immersed in a stripping solution.

The upper layer radiation sensitive resin composition is removed by immersing the substrate in the stripping solution. Preferred examples of the stripping solution include dimethyl sulfoxide, ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, diethylene glycol monobutyl ether, propylene glycol monomethyl ether acetate, propylene glycol monopropyl ether acetate, tripropylene glycol diethyl ether, tripropylene glycol dimethyl ether, methyl ethyl ketone, 2-heptanone, 3-heptanone, 4-heptanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-ethoxypropionate, ethyl 3-methoxypropionate, ethyl acetate, butyl acetate, methyl pyruviate, ethyl pyruviate, phenol and the like. Further, a high-boiling solvent such as dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, α-butyrolactone, perchloroethylene, ethylene carbonate, propylene carbonate or ethylene glycol monophenyl ether acetate may be added. These solvents may be used alone or in combination of two or more. The polarity and the like of the stripping solution may be adjusted by adding an aromatic hydrocarbon such as tetralin, toluene or xylene, alkylbenzenesulfonic acid such as p-toluenesulfonic acid or dodecylbenzenesulfonic acid or water to these.

The stripping solution may be an aqueous solution of an alkali such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, N-methyl-2-pyrrolidone, dimethylethanolamine, triethanolamine, tetramethylammonium hydroxide, tetraethylammonium hydroxide, choline, pyrrole, piperidine, 1,8-diazabicyclo-(5,4,0)-7-undecene, 1,5-diazabicyclo(4,3,0)-5-nonene and the like. When an alkali aqueous solution is used, the upper layer radiation sensitive resin composition is preferably positive. In this case, the radiation sensitive resin composition is exposed to radiation to enhance the alkali solubility of the upper layer.

The substrate is immersed in the above stripping solution at 0 to 120° C. for 10 to 1,000 seconds to dissolve the upper layer portion in the developer and remove it from the lower layer.

(6) Finally, the alkali-soluble thermosetting resin remaining on the substrate is heated to obtain a cured film pattern.

That is, the lower layer film obtained in the step (5) is heated with a heating device such as a hot plate or oven at a predetermined temperature, for example, 100 to 300° C. for a predetermined time to obtain a interlayer film pattern.

When the dielectric constant of the thus obtained cured film is measured at a frequency of 1 MHz, it is 3.5 or less, preferably 3.2 or less. The cured film has excellent physical properties such as high resolution, insulating properties, flatness, heat resistance and transparency. Therefore, it is useful as a protective film, flattening film and interlayer insulating film for electronic parts, particularly an interlayer insulating film for liquid crystal display elements, integrated circuit elements and solid image pick-up elements.

The following examples are given to further illustrate the present invention.

Synthesis Example 1 (synthesis of resin a-1)

After 57 g (0.6 mol) of m-cresol, 38 g (0.4 mol) of p-cresol, 75.5 g (0.93 mol of formaldehyde) of a 37 wt % aqueous solution of formaldehyde, 0.63 g (0.005 mol) of oxalic acid dehydrate and 264 g of methyl isobutyl ketone were charged into a flask equipped with a condenser tube, stirrer and thermometer, the flask was immersed in an oil bath to carry out polycondensation for 4 hours under stirring while the reaction solution was refluxed. Thereafter, the temperature of the oil bath was raised over 3 hours, the pressure in the flask was reduced to 30 to 50 mHg to remove a volatile content, and the molten resin a was cooled to room temperature and collected. This resin was dissolved in ethyl acetate to ensure that the resin content should be 30%, and methanol and water were added in amounts 1.3 times and 0.9 time the weight of the solution, respectively, stirred and left to stand. An under layer of the solution which was separated into two layers was taken out, condensed and dried to collect the resin a. This resin (Mw of 8,000) was taken as resin a-1.

Synthesis Example 2 (synthesis of resin a-2)

Resin a-2 (Mw of 6,000) was synthesized in the same manner as in Synthesis Example 1 except that 76 g (0.8 mol) of m-cresol, 13.9 g (0.12 mol) of 2,3-xylenol, 9.3 g (0.08 mol) of 3,4-xylenol, 78 g (0.96 mol of formaldehyde) of a 37 wt % aqueous solution of formaldehyde, 0.63 g (0.005 mol) of oxalic acid dihydrate and 264 g of methyl isobutyl ketone were used.

Synthesis Example 3 (synthesis of resin a-3)

176 Grams (0.1 mol) of t-butoxystyrene and 5.8 g (0.04 mol) of azobisbutyronitrile were dissolved in 250 ml of propylene glycol monomethyl ether and polymerized at 75° C. for 4 hours. The thus obtained poly-t-butoxystyrene solution was mixed with 50 g of a 5 wt % aqueous solution of sulfuric acid and heated at 100° C. for 3 hours to carry out hydrolysis. The obtained product was washed with 1,000 ml of deionized water three times and mixed with 500 ml of 2-heptanone to substitute the solvent. Polyhydroxystyrene having an Mw of 24,000 was obtained at an yield of 95%. This resin was taken as resin a-3.

Synthesis Example 4 (synthesis of PAC-1)

4.28 Grams (0.01 mol) of the following compound (a) was dissolved in 30 g of tetrahydrofuran and 2.8 g (0.028 mol) of triethylamine was added. 7.11 Grams (0.025 mol) of 1,2-naphthoquinonediazide-5-sulfonyl chloride was added over 30 minutes while the resulting solution was cooled to 0 to 5° C. After 5 hours, the precipitated triethylamine hydrochloride was filtered, re-precipitated in 2,000 ml of a 0.2 wt % aqueous solution of hydrochloric acid diluted with deionized water, filtered, washed with water 3 times and vacuum dried at 40° C. to obtain 9.2 g of a condensation compound. This compound was taken as PAC-1.

Synthesis Example 5 (synthesis of PAC-2)

6 Grams of a condensation compound was obtained in the same manner as described above except that 3.68 g (0.01 mol) of the following compound (b) in place of the compound (a), 1.67 g (0.0165 mol) of triethylamine and 4.3 g (0.015 mol) of 1,2-naphthoquinonediazide-5-sulfonyl chloride were used. This compound was taken as PAC-2.

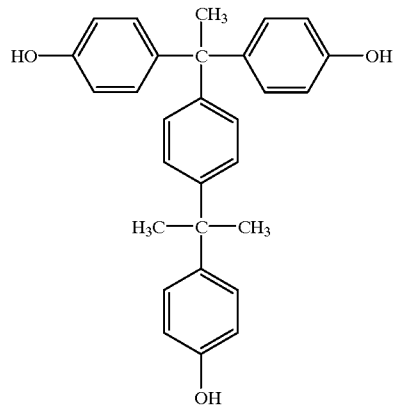

(a)

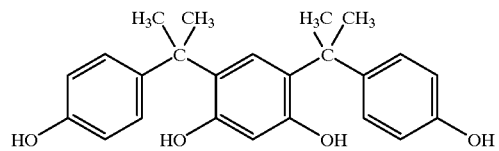

(b)

Preparation Example 1 (preparation of radiation sensitive resin composition [A-1])

100 Parts by weight of the resin a-1 obtained in Synthesis Example 1, 30 parts by weight of PAC-1 obtained in Synthesis Example 3, 530 parts by weight of propylene glycol monomethyl ether acetate as a solvent and 0.01 g of M EGAFAC F-173 (manufactured by Dainippon Ink & Chemicals, Inc.) as a surfactant were added, mixed and dissolved, and the resulting solution was filtered with a Millipore filter having a pore diameter of 0.50 μm to prepare a radiation sensitive resin composition [A-1] for an upper layer.

Preparation Examples 2 to 7 (preparation of radiation sensitive resin compositions [A-2] to [A-7])

Radiation sensitive resin compositions were prepared in the same manner as in Preparation Example 1 except that components shown in Table 1 and 0.01 g of M EGAFAC F-173 (manufactured by Dainippon Ink & Chemicals, Inc.) as a surfactant were used.

TABLE 1

| composition | resin kind | parts by weight | radiation sensitive compound kind | parts by weight | dissolution promoting agent kind | parts by weight | solvent kind | parts by weight |
|---|---|---|---|---|---|---|---|---|
| A-1 | a-1 | 100 | PAC-1 | 30 | — | — | c-1 | 530 |
| A-2 | a-1 | 100 | PAC-2 | 35 | — | — | c-2 | 300 |
|  |  |  |  |  |  |  | c-3 | 200 |
| A-3 | a-2 | 100 | PAC-1 | 26 | — | — | c-3 | 100 |
|  |  |  |  |  |  |  | c-4 | 400 |

TABLE 1-continued

| composition | resin kind | parts by weight | radiation sensitive compound kind | parts by weight | dissolution promoting agent kind | parts by weight | solvent kind | parts by weight |
|---|---|---|---|---|---|---|---|---|
| A-4 | a-3 | 100 | PAC-1 | 26 | — | — | c-3 | 100 |
|  |  |  |  |  |  |  | c-4 | 400 |
| A-5 | a-4 | 100 | PAC-2 | 40 | compound (a) | 15 | c-4 | 500 |
| A-6 | a-5 | 100 | PAC-1 | 30 | compound (b) | 12 | c-4 | 400 |
|  |  |  |  |  |  |  | c-5 | 100 |
| A-7 | a-6 | 100 | PAC-2 | 26 | — | — | c-6 | 500 |

Compounds in Table 1 are as follows.

<resin> a-4: polyhydroxystyrene/hydrogenated polyhydroxystyrene (90/10) copolymer (PHM-C of Maruzen Petrochemical Co., Ltd., having an Mw of 9,000)

a-5: vinylphenol/methyl methacrylate(50/50) copolymer (MARUKALYNCUR CMM of Maruzen Petrochemical Co., Ltd., having an Mw of 10,000)

a-6: vinylphenol/styrene(50/50) copolymer (MARUKALYNCUR CST50 of Maruzen Petrochemical Co., Ltd., having an Mw of 4,000).

<solvent> c-1: propylene glycol monomethyl ether acetate c-2: methyl 3-methoxypropionate c-3: ethyl 3-ethoxypropionate c-4: 2-heptanone c-5: butyl acetate c-6: cyclohexanone.

Preparation Example 8

10 Grams of a copolymer comprising (b-1), (b-2) and (b-3) components shown in Table 2, 0.05 g of 3-glycidoxypropyl trimethoxysilane as an adhesion auxiliary and 0.005 g of M EGAFAC F-172 (manufactured by Dainippon Ink & Chemicals, Inc.) as a surfactant were mixed together, and the resulting mixture was dissolved in diethylene glycol ethyl methyl ether to ensure that a solid content should be 30 wt %, and the obtained solution was filtered with a Millipore filter having a pore diameter of 0.22 $\mu$m to prepare a thermosetting resin composition [B-1] to [B-5] for a lower layer.

TABLE 2

|  |  | B-1 | B-2 | B-3 | B-4 | B-5 |
|---|---|---|---|---|---|---|
| (b-1) | methacrylic acid | 22 | 20 | 21 |  |  |
|  | acrylic acid |  |  |  | 27 | 17 |
| (b-2) | glycidyl methacrylate | 38 | 55 | 34 | 33 | 60 |
|  | p-vinylbenzyl glycidyl ether |  | 25 | 35 |  |  |
| (b-3) | butadiene |  |  |  | 10 |  |
|  | styrene | 15 |  | 10 |  | 23 |
|  | t-butyl methacrylate | 5 |  |  |  |  |
|  | dicyclopentanyl methacrylate | 20 |  |  | 30 |  |
| polymerization initiator | 2,2'-azobis(2,4-dimethylvaleronitrile) | 4 | 7 | 10 |  |  |
|  | 2,2'-azobisisobutyronitrile |  |  |  | 5 | 4 |
| solvent | diethylene glycol methyl ethyl ether | 200 | 200 | 200 | 200 | 200 |
| polymerization temperature |  | 70 | 75 | 70 | 70 | 70 |
| polymerization time |  | 5 | 5 | 3 | 5 | 6 |
| concentration of copolymer in polymer solution (%) |  | 33.0 | 33.3 | 33.1 | 33.2 | 33.5 |
| Mw($\times 10^4$) |  | 4.53 | 1.70 | 0.80 | 1.42 | 4.32 |

Example 1

(1) Coating

The solution of the thermosetting resin composition [B-1] obtained in Preparation Example 8 was coated on a silicon substrate using a spinner and prebaked on a hot plate heated at 90° C. for 60 seconds to form a 3.0 $\mu$m thick coated film. Thereafter, the solution of the radiation sensitive resin composition [A-1] was coated on the coated film of the thermosetting resin composition on the silicon substrate using a spinner and prebaked on a hot plate heated at 90° C. for 60 seconds to form a 1.5 $\mu$m thick coated film.

(2) Patterning

A mask having a predetermined pattern was placed on the silicon substrate having the above two layers of coated films, and the substrate was exposed to ultraviolet radiation having a wavelength of 365 nm and a light intensity of 10 mW/cm$^2$ to ensure that the amount of energy should be 50 mJ/cm$^2$ in the air. Thereafter, development was carried out using a 2.38 wt % (0.26 N) aqueous solution of tetramethylammonium hydroxide at 23° C. for 50 seconds to pattern the upper layer and the lower layer en bloc into a positive pattern. The substrate was then rinsed with ultra-purified water for 60 seconds. Thereafter, the substrate was further heated at 80° C. for 10 minutes.

(3) Removal of Upper Layer Radiation Sensitive Film

The patterned films were immersed in a mixed solvent of 70 parts by weight of butyl acetate and 30 parts by weight of 2-heptanone at 23° C. for 50 seconds to remove the upper layer film. Thereafter, the substrate was rinsed with ultra-purified water for 60 seconds.

(4) Formation of Cured Film

The obtained positive pattern was heated at 250° C. for 1 hour to obtain a cured film.

The obtained cured film was used for the evaluation of transparency, flatness, heat resistance, resolution and dielectric constant using the following evaluation conditions. The results are shown in Table 3.

Examples 2 to 10

The steps (1) and (2) of Example 1 were carried out using radiation sensitive resin compositions and thermosetting resin compositions shown in Table 3 below. The baking conditions after development in the step (2) are shown in Table 3. Thereafter, cured films were obtained by carrying out the step (3) of Example 1 using stripping solutions shown in Table 3 and then, the step (4) of Example 1.

The obtained cured films were used for the evaluation of transparency, flatness, heat resistance, resolution and dielectric constant using the following evaluation conditions. The results are shown in Table 3.

Comparative Examples 1 and 2

The steps (1), (3), (4) and (6) were carried out on a single layer by adding 28 parts by weight of the radiation sensitive compound PAC-1 obtained in Synthesis Example 3 to [B-1] in Comparative Example 1 and 37 parts by weight of PAC-2 obtained in Synthesis Example 4 to [B-3] in Comparative Example 2.

The obtained cured films were used for the evaluation of transparency, flatness, heat resistance, resolution and dielectric constant using the following evaluation conditions. The results are shown in Table 3.

Evaluation of Resolution

The minimum size of the resolved space pattern of each of the thin films formed as described above was measured with a scanning electron microscope.

Measurement of Dielectric Constant

The dielectric constant of each of the thermally cured films obtained as described above was measured with a dielectric constant measuring instrument (of Hewlett Packard Co. Ltd.) at room temperature at 1 MHz.

Evaluation of Heat Resistance

After the thickness of each of the cured films was measured, the silicon substrate having the cured film formed thereon was further heated in an oven at 250° C. for 30 minutes. The thickness of the cured film heat-treated was measured to obtain the resin residue rate of the cured film.

Heat resistance was evaluated as good (○) when the resin residue rate by heating is more than 95%, as moderate (Δ) when the resin residue rate is 90 to 95% and as bad (X) when the resin residue rate is less than 90 %.

Evaluation of Flatness

A cured film was formed on a silicon oxide film substrate by the same steps as the above steps (1) to (3) except that the silicon oxide film substrate having a surface roughness of 1.0 μm was used in place of the silicon substrate.

The level difference of the cured film was measured using a contact type film thickness measuring instrument. Flatness is evaluated as good (○) when the maximum level difference is less than 5% and as bad (X) when the maximum level difference is 5% or more.

Evaluation of Transparency

A cured film was formed on a glass substrate by the same steps as the above steps (1) to (3) except that the glass substrate [trade name: Corning 7059 (manufactured by Corning Co., Ltd.)] was used in place of the silicon substrate and the transparency was measured using the TC1800 Color Analyzer of Tokyo Denshoku Co., Ltd.

TABLE 3

| | upper layer film | lower layer film | stripping solution | | baking conditions after development | |
|---|---|---|---|---|---|---|
| | | | type | parts by weight | temperature (°C.) | time (min) |
| Ex. | | | | | | |
| 1 | A-1 | B-1 | butyl acetate | 70 | 80 | 10 |
| | | | 2-heptanone | 30 | | |
| 2 | A-1 | B-2 | dimethyl sulfoxide | 83 | 100 | 15 |
| | | | water | 17 | | |
| 3 | A-2 | B-3 | dimethyl sulfoxide | 100 | 150 | 10 |
| 4 | A-2 | B-4 | tripropylene glycol dimethyl ether | 60 | 50 | 5 |
| | | | isopropyl alcohol | 40 | | |
| 5 | A-3 | B-5 | butyl acetate | 100 | not baked | |
| 6 | A-4 | B-1 | dimethyl sulfoxide | 50 | 110 | 10 |
| | | | N-methylpyrrolidone | 40 | | |
| | | | diethylene glycol monobutyl ether | 10 | | |
| 7 | A-5 | B-2 | dimethyl sulfoxide | 70 | 100 | 15 |
| | | | water | 30 | | |
| 8 | A-6 | B-3 | dimethyl sulfoxide | 100 | 140 | 10 |

TABLE 3-continued

| | | | | | | |
|---|---|---|---|---|---|---|
| 9 | A-7 | B-4 | cyclohexanone | 60 | 50 | 5 |
| | | | N-methylpyrrolidone | 40 | | |
| 10 | A-4 | B-4* | tetramethyl ammonium hydroxide | 1.7 | 130 | 3 |
| | | | water | 98.3 | | |
| C. Ex. | | | | | | |
| 1 | — | B-1 +PAC-1 | — | | — | not baked |
| 2 | — | B-3 +PAC-2 | — | | — | not baked |

| | transparency (%) | flatness | heat resistance | resolution (μm) | dielectric constant |
|---|---|---|---|---|---|
| Ex. | | | | | |
| 1 | 97 | ○ | ○ | 5 | 3.1 |
| 2 | 96 | ○ | ○ | 4 | 3.4 |
| 3 | 97 | ○ | ○ | 4 | 3.5 |
| 4 | 96 | ○ | ○ | 5 | 3.1 |
| 5 | 98 | ○ | ○ | 4 | 3.5 |
| 6 | 98 | ○ | ○ | 3 | 3.1 |
| 7 | 96 | ○ | ○ | 4 | 3.4 |
| 8 | 97 | ○ | ○ | 4 | 3.5 |
| 9 | 97 | ○ | ○ | 3 | 3.1 |
| 10 | 97 | ○ | ○ | 4 | 3.1 |
| C. Ex. | | | | | |
| 1 | 86 | Δ | Δ | 6 | 3.2 |
| 2 | 80 | Δ | X | 6 | 3.6 |

(Note) Ex. = Example, C. Ex. = Comparative Example
*under exposure to radiation of g-line, h-line and i-line at 300 mJ/cm$^2$, for shipping According to the present invention, a thermosetting resin composition which is generally inappropriate for patterning having high-sensitivity and high-resolution is obtained, and a cured film obtained by curing the thermosetting resin composition has a low dielectric constant and is excellent in such physical properties as flatness, heat resistance, transparency and insulating properties. Particularly, the heat resistance of the cured film is such that light transmittance is extremely high after heating at 250° C. for 30 minutes.

Therefore, the cured film is useful as a protective film, flattening film and interlayer insulating film for electronic parts, particularly an interlayer insulating film for liquid crystal display elements, integrated circuit elements and solid image pick-up elements.

What is claimed is:

1. A process for forming a cured film comprising the steps of:
   (1) coating an alkali-soluble thermosetting resin composition on a substrate, and baking it to form a lower layer film, wherein the alkali-soluble thermosetting resin composition is a copolymer of (b-1) at least one compound selected from the group consisting of unsaturated carboxylic acids and unsaturated carboxylic anhydrides, (b-2) an epoxy group-containing radical polymerizable unsaturated compound, and (b-3) a radical polymerizable unsaturated compound other than (b-1) and (b-2) selected from the group consisting of (meth)acryloyl group-containing radical polymerizable compounds, vinyl group-containing radical polymerizable compounds and unsaturated dicarboxylic diesters;
   (2) coating a radiation sensitive resin composition on the lower layer film, and baking it to form an upper layer film, wherein the radiation sensitive resin composition comprises at least one aprotic solvent selected from the group consisting of 2-heptanone, 3-heptanone, 4-heptanone, methyl-n-hexylketone, methyl-n-octylketone methyl-n-dodecylketone, ethyl-n-pentylketone, di-n-propylketone, diisopropyl ketone, n-propylisopropyl ketone, di-n-butylketone, di-n-pentylketone, 2-methylcyclohexanone, 3-methylcyclohexanone, 4-methylcyclohexanone, 2-ethylcyclohexanone, 4-ethylcyclohexanone, methyl-n-hexylketone, 2-t-butylcyclohexanone, cycloheptanone, cyclooctanone, cyclononanone, and cycloundecanone;
   (3) exposing the radiation sensitive resin composition to radiation through a predetermined mask and baking it;
   (4) carrying out development with an alkaline developer;
   (5) immersing the substrate carrying the films in a stripping solution to remove the upper layer film; and
   (6) heating the lower layer film of alkali-soluble thermosetting resin remaining on the substrate to obtain a cured film pattern.

2. The process of claim 1, wherein the radiation sensitive resin composition is a combination of a sensitizer and an alkali-soluble resin selected from the group consisting of an alkali-soluble novolak resin, polyvinylphenol and copolymer of vinylphenol and an olefin copolymerizable therewith.

3. The process of claim 1, wherein baking in the step (1) is carried out at 50 to 200° C. for 0.5 to 15 minutes.

4. The process of claim 1, wherein baking in the step (2) is carried out at 50 to 200° C. for 0.5 to 15 minutes.

5. The process of claim 1, wherein immersion in the step (5) is carried out at 0 to 120° C. for 10 to 1,000 seconds.

6. The process of claim 1, wherein at least either one step of baking and exposure to radiation is additionally carried out between the steps (4) and (5).

7. The process of claim 6, wherein baking to be carried out between the steps (4) and (5) is carried out at a temperature higher than the baking temperatures of the steps (1) to (3).

* * * * *